United States Patent

Maekawa et al.

[11] Patent Number: 6,137,705
[45] Date of Patent: Oct. 24, 2000

[54] DRIVE CONTROL AND PROTECTION CIRCUIT FOR A CAR POWER INVERTER

[75] Inventors: Hirotoshi Maekawa, Tokyo; Kiyoharu Anzai, Hyogo; Eiji Tutiya, Tokyo, all of Japan

[73] Assignee: Mitsubishi Denki Kabushiki Kaisha, Tokyo, Japan

[21] Appl. No.: 09/434,108

[22] Filed: Nov. 5, 1999

[30] Foreign Application Priority Data

May 28, 1999 [JP] Japan .................................. 11-149928

[51] Int. Cl.⁷ .............................................. H02M 7/5387
[52] U.S. Cl. ........................................... 363/132; 363/147
[58] Field of Search ...................................... 363/132, 147

[56] References Cited

U.S. PATENT DOCUMENTS

| | | | |
|---|---|---|---|
| 5,077,595 | 12/1991 | Fukunaga | 363/147 |
| 5,253,156 | 10/1993 | Sakurai et al. | 363/147 |
| 5,313,150 | 5/1994 | Arakawa et al. | 363/147 |
| 5,604,674 | 2/1997 | Terasawa | 363/132 |
| 5,905,647 | 5/1999 | Shirai | 363/147 |

FOREIGN PATENT DOCUMENTS 9-51068  2/1999  Japan ................ H01L 23/58

*Primary Examiner*—Jeffrey Sterrett
*Attorney, Agent, or Firm*—Sughrue, Mion, Zinn, Macpeak & Seas, PLLC

[57] ABSTRACT

A power inverter having high reliability in a severe use environment with reduced delay in switching times and rounding of waveforms. Specifically, the power inverter utilizes switching element drive and protection circuits, and a control arithmetic unit (CAU) formed on a single substrate through a high-voltage integrated circuit. Additionally, the ground potentials (GND) of the switching element drive and protection circuits, and the CAU are made equal to the ground potentials of the switching elements and the power inversion portion of the circuit. Finally, the power inversion portion and a smoothing capacitor are constructed using the same module as the substrate.

3 Claims, 5 Drawing Sheets

DRIVE CONTROL AND PROTECTION CIRCUIT FOR A CAR POWER INVERTER

BACKGROUND OF THE INVENTION

1. Field of the Invention

The present invention relates to an electrically insulating method for a car power inverter comprising semiconductor switching elements and to a reduction in the size of the inverter and the improvement of reliability of the inverter.

2. Description of the Prior Art

FIG. 4 is a circuit block diagram showing the configuration of the power source of a prior art car power inverter. The figure shows only a one-phase circuit for a switching portion for driving a three-phase AC load. Circuits for the other two phases are omitted because they are identical to the above circuit (refer to the whole circuit block diagram of FIG. 5).

In FIG. 4, reference numeral 1 denotes a high-voltage DC power source for driving an unshown AC load. For such application as electric cars, several tens to several hundreds of volts is generally used. The above DC power source 1 is electrically insulated from a car body for safety. Reference numeral 2 signifies two switching elements forming one arm of a switching portion. The two switching elements 2 are arranged in series between both ends of the DC power source 1. A power element typified by an IGBT (Insulated Gate Bipolar Transistor) is generally used as the switching element 2, and DC power from the above DC power source 1 is inverted into 3-phase AC power by the switching operation of the switching elements 2 forming 3 arms connected in parallel as will be described hereinafter. Denoted by 3 is a fly wheel diode, paired with the above switching element 2, for returning a reflux current at the time of switching to the AC load or the DC power source 1.

Denoted by 4 is a circuit for driving the above switching element 2 and protecting it from overheating, short-circuit current and the like. This circuit is connected to the drive signal output port and switching abnormal signal input port of a microcomputer 5 through photocouplers 8. Reference numeral 10 denotes a capacitor for smoothing a ripple current at the time of switching. The drive voltage of the microcomputer 5 is supplied from a low-voltage DC power source 6 and regulated to 5 V by a general constant-voltage regulator circuit 7.

Thus, in the case of an electric car or hybrid electric car, two different DC power sources are generally used. That is, a 12 V battery generally used for automobiles is used as the low-voltage DC power source 6 and the GND potential of the power source is grounded to the car body so that it is made equal to the potential of the car body.

The high-voltage DC power source 1 is electrically insulated from the car body in most cases because it generates a high voltage and the drive and protective circuits 4 are electrically insulated from the microcomputer 5 using insulating elements for the prevention of a safety problem such as an electric shock and the operation principle of the switching elements (difference in operation reference voltage). The photocoupler 8 which is relatively inexpensive and easily acquired is used as the insulating element.

The body earth is represented by "Z" below.

The whole circuit block diagram of the car power inverter of FIG. 5 will be described hereinunder. Elements having the same reference symbols as in FIG. 4 have the same functions.

A high-voltage power inverter 9 which is the main circuit of a car power inverter comprises a DC power source 1, a smoothing capacitor 10 and a switching portion consisting of 3 pairs of switching elements 2 and 3 pairs of fly wheel diodes 3 connected in parallel, and inverts a DC voltage obtained by smoothing a ripple current at the time of switching between the terminals of the smoothing capacitor 10 into a 3-phase AC voltage and supplies variable-voltage and variable-frequency 3-phase AC power to a 3-phase AC load 11 such as an AC motor. An IGBT is generally used as the switching element 2 in most cases and G stands for gate, C collector and E emitter in FIG. 5.

Switching element drive and protective circuits 4 amplify a drive signal from a control arithmetic unit 12 which is an AC load control circuit provided separate from the above power inverter 9 and then turns on or off the switching elements to carry out switching operation required to invert the DC power of the DC power source unit 1 into variable-voltage and variable-frequency 3-phase AC power. A digital signal drive method typified by PWM control is used in most cases. The above drive and protective circuits 4 serve to protect the switching elements 2 based on a sensor signal from an unshown sensor for detecting the overheating or short-circuit current of the switching element 2. Therefore, the control arithmetic unit 12 generally incorporates a microcomputer 5 for carrying out computation for the control of the AC load, receives each phase current of the 3-phase AC load 11 detected by a current detector 13, a 3-phase AC load torque control instruction signal from a car controller 14 and an alarm signal, and controls the power inverter 9 having various protection functions.

Since the car power inverter of the prior art is constituted as described above, the switching element drive and protective circuits 4 must be electrically insulated from the control arithmetic unit 12 for safety or operation principle. A photocoupler 8 composed of an optical semiconductor element is often used as the insulation element.

However, when this photocoupler 8 is used in the extremely severe environment of a temperature cycle for the properties and structure of the optical semiconductor, as in an automobile, the sealing properties of an optical coupling portion deteriorate and coupling (amplification) between a primary side and a secondary side lowers. In the worst case, the primary side and the secondary side are not coupled with each other and there arises such a reliability problem that a signal cannot be transmitted (product life). Since a signal conversion process (electric signal→optical signal→electric signal) is required for insulation, there occur a delay and the rounding of waveform between an input signal and an output signal, and a switching time width required for PWM drive cannot be ensured.

SUMMARY OF THE INVENTION

The present invention has been made to solve the above problems and it is an object of the present invention to provide a power inverter which improves the delay of switching time and the rounding of waveform and has high reliability even in a severe use environment as in an automobile and to integrate a high-voltage circuit and reduce the size of a power inversion control circuit.

According to a first aspect of the present invention, there is provided a car power inverter, wherein switching element drive and protective circuits and a control arithmetic unit are formed on the same substrate through signal transmission means, having an insulating function, for transmitting a signal between the drive and protective circuits and the control arithmetic unit, and a power inversion portion comprising switching elements and a smoothing capacitor is constructed using the same module as the substrate.

According to a second aspect of the present invention, there is provided a car power inverter, wherein the above signal transmission means is composed of an HVIC (High Voltage Integrated Circuit) and not an insulating element such as a photocoupler.

According to a third aspect of the present invention, there is provided a car power inverter, wherein the ground potentials (GND) of the switching element drive and protective circuits and the control arithmetic unit formed on the same substrate are made equal to the ground potentials (GND) of the switching elements.

The above and other objects, features and advantages of the invention will become more apparent from the following description when taken in conjunction with the accompanying drawings.

BRIEF DESCRIPTION OF THE ACCOMPANYING DRAWINGS

DETAILED DESCRIPTION OF THE PREFERRED EMBODIMENTS

Preferred embodiments of the present invention will be described hereinunder with reference to the accompanying drawings.

In the following description, the same and corresponding elements as those of the prior art are given the same reference symbols.

Embodiment 1

Figure 1:
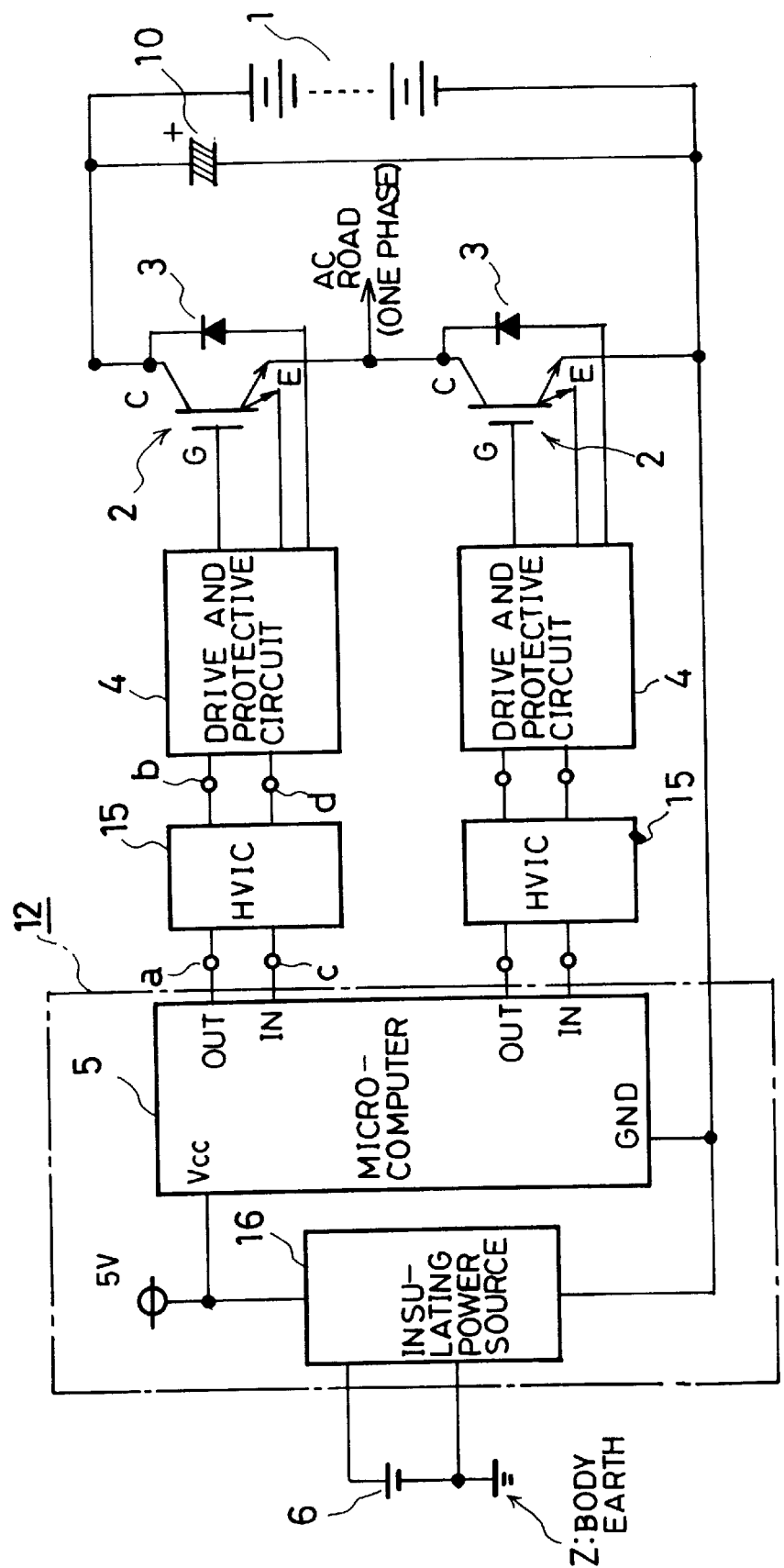
FIG. 1 is a power source circuit block diagram of a car power inverter according to an embodiment of the present invention.

FIG. 1 is a circuit block diagram showing the power source constitution of a car power inverter according to Embodiment 1 of the present invention. FIG. 1 shows only a one-phase circuit for a switching portion for driving a 3-phase AC load.

In FIG. 1, reference numeral 1 denotes a high-voltage DC power source, 2 switching elements composed of an IGBT, 3 fly wheel diodes, 4 switching element drive and protective circuits, 10 a smoothing capacitor, 12 a control arithmetic unit comprising a microcomputer 5 for carrying out computation for the control of an AC load and a low-voltage DC power source 6, 15 HVIC's (High Voltage Integrated Circuit) as signal transmission means having the function of insulating the control arithmetic unit 12 from the drive and protective circuits 4 and transmitting a signal between the control arithmetic unit 12 and the drive and protective circuits 4, and 16 an insulating power source for supplying a voltage to the microcomputer 5.

The car power inverter of this embodiment differs from the car power inverter of the prior art in that the HVIC 15 is used in place of the photocoupler 8 which is an element for insulating the microcomputer 5 incorporated in the control arithmetic unit 12 as an AC load control circuit from the switching element drive and protective circuits 4, the GND of the microcomputer 5 is connected to the GND of the high-voltage DC power source 1, and the insulating power source 16 for obtaining 5 V from the low-voltage DC power source 6 is used as a power source for the microcomputer 5. Thus, electric insulation at least from the car body is effected.

The HVIC is a known high-voltage semiconductor integrated circuit which incorporates Nch MOS's for shifting signal levels from a low voltage to a high voltage and Pch MOS's for shifting signal levels from a high voltage to a low voltage. The HVIC generally has a JI or DI type structure. Since the above HVIC can ensure insulation resistance equivalent to a MOS gate, it is implemented as signal transmission means having an insulation function in the industrial and commercial fields.

Figure 2:
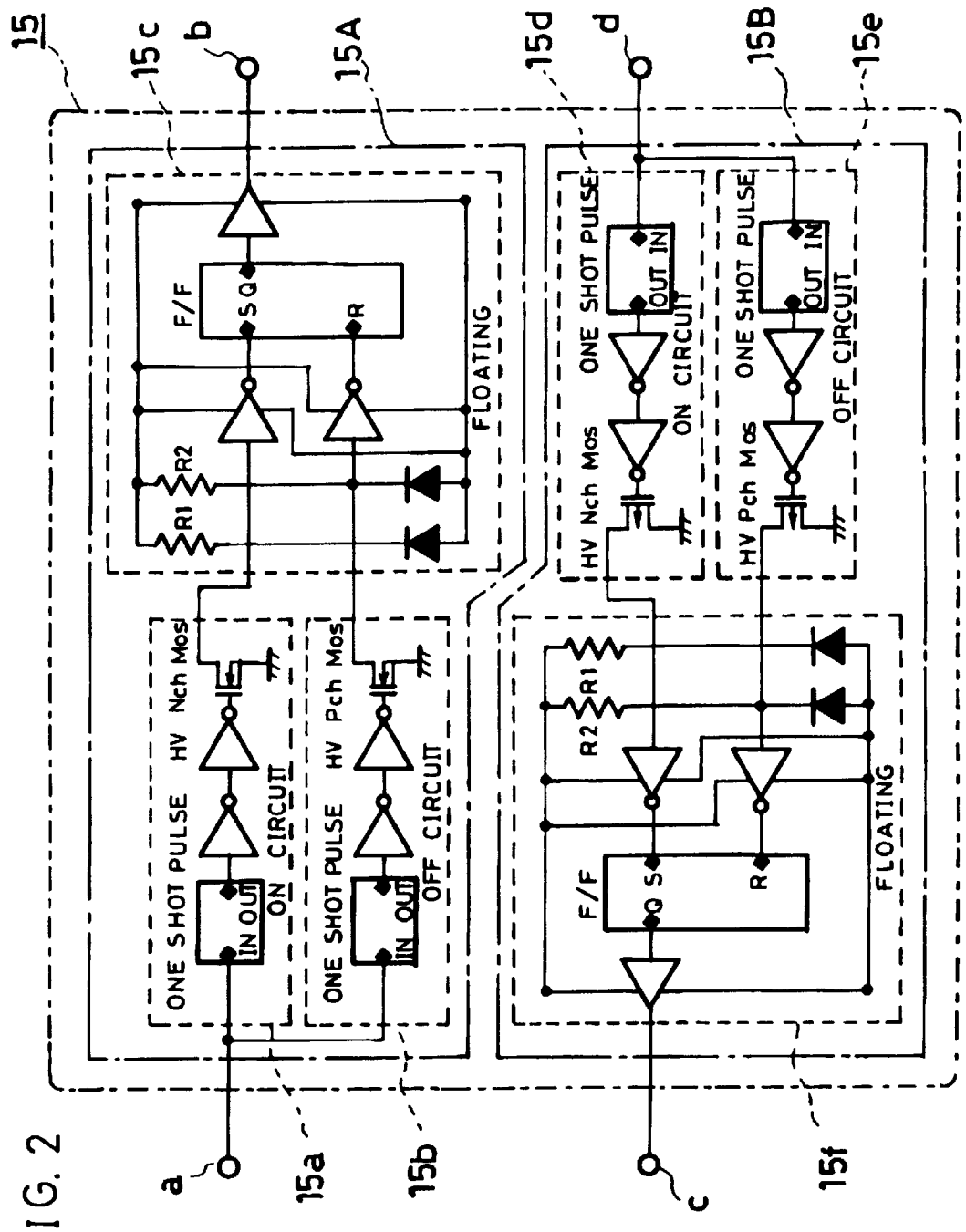
FIG. 2 is an equivalent circuit block diagram of an HVIC.

As shown in the equivalent circuit block diagram of FIG. 2, the HVIC consists of a first signal transmission circuit 15A for transmitting a signal from the microcomputer 5 to the switching element drive and protective circuit 4, which comprises an ON circuit 15a and an OFF circuit 15b, each having a high-voltage Nch MOS (HV Nch MOS) connected to the output port of the microcomputer 5 through a connection point "a", and an SR-FF (Slave Flip-flop) 15c which operates in response to the outputs of the ON circuit 15a and the OFF circuit 15b, and a second signal transmission circuit 15B for transmitting a signal from the drive and protective circuit 4 to the microcomputer 5, which comprises an ON circuit 15d and an OFF circuit 15, each having an HV Pch MOS connected to the output of the drive and protective circuit 4 through a connection point "d", and an SR-FF 15f which operates in response to the outputs of the ON circuit 15d and the OFF circuit 15e, and has the function of insulating the drive and protective circuit 4 from the microcomputer 5 and transmits a signal between the drive and protective circuit 4 and the microcomputer 5.

That is, in the first signal transmission circuit 15A, the ON circuit 15a becomes active at a rising edge of an input pulse from the connection point "a" and the OFF circuit 15b becomes active at a falling edge, thereby forming two signal lines and activating the SR-FF 15c. When the HV Nch MOS of the ON circuit 15a is turned on, the SR-FF 15c is set and the potential of the connection point "b" for the drive and protective circuit 4 becomes high. When the HV Nch MOS of the OFF circuit 15b is turned on, the SR-FF 15c is reset and the potential of the connection point "b" becomes low. As a result, a signal from the microcomputer 5 is transmitted to the switching element drive and protective circuit 4.

The second signal transmission circuit 15B differs from the first signal transmission circuit 15A in that the high-voltage MOS is a Pch MOS and the circuit carries out similar operation to transmits a signal from the switching element drive and protective circuit 4 to the microcomputer 5.

A description is subsequently given of the operation of the car power inverter constituted above.

The microcomputer 5 is incorporated in the control arithmetic unit 12, outputs a PWM signal in a predetermined pattern, and turns on or off the switching element drive and protective circuit 4 through the HVIC 15 to drive the switching element so as to invert power from the high-voltage DC power source 1 into variable-voltage and variable-frequency 3-phase AC power. When abnormality such as overheating or short-circuit current occurs in the switching elements 2, the switching element drive and protective circuit 4 shuts off a gate signal to the switching element 2 and informs the microcomputer 5 of the abnormality through the HVIC 15.

Since the car power inverter of this embodiment uses the HVIC 15 to transmit a signal between elements having different GND levels, the GND of the microcomputer 5 is connected to the GND of the high-voltage DC power source 1 without using a photocoupler, thereby making it possible to reduce the size of a power inversion control circuit.

Embodiment 2

Figure 3:
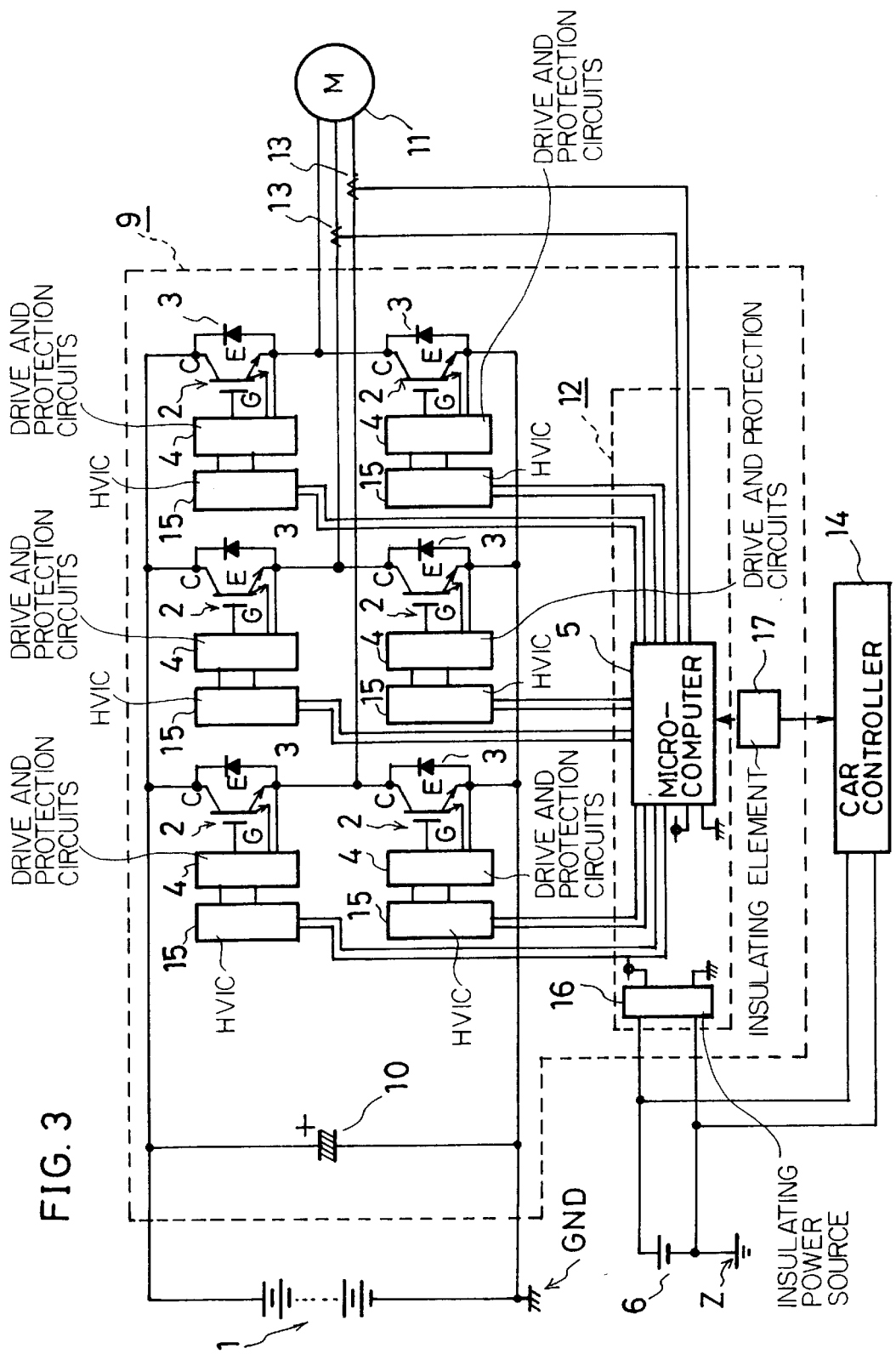
FIG. 3 is a whole circuit block diagram of a car power inverter according to another embodiment of the present invention.
Figure 4:
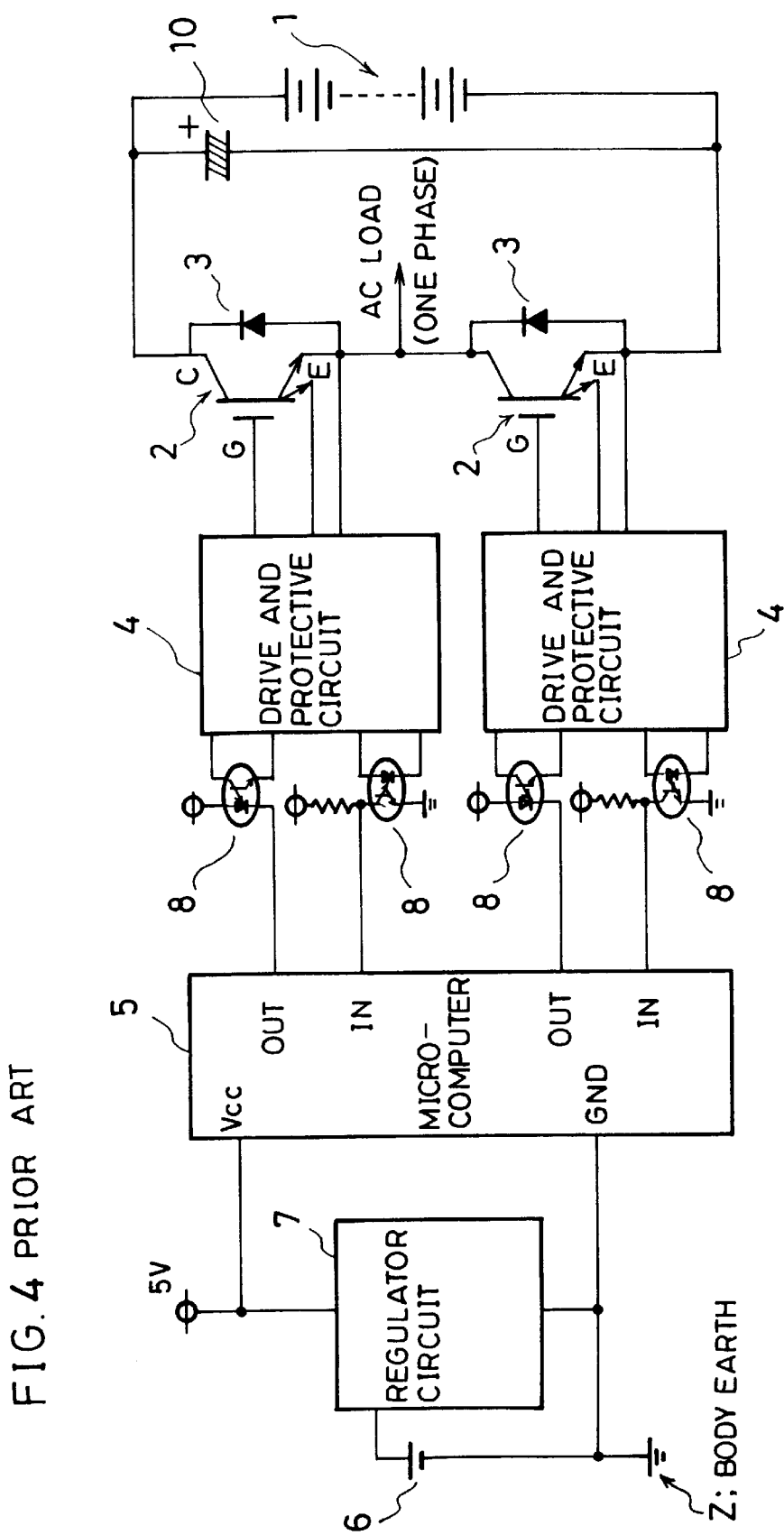
FIG. 4 is a power source circuit block diagram of a car power inverter of the prior art.
Figure 5:
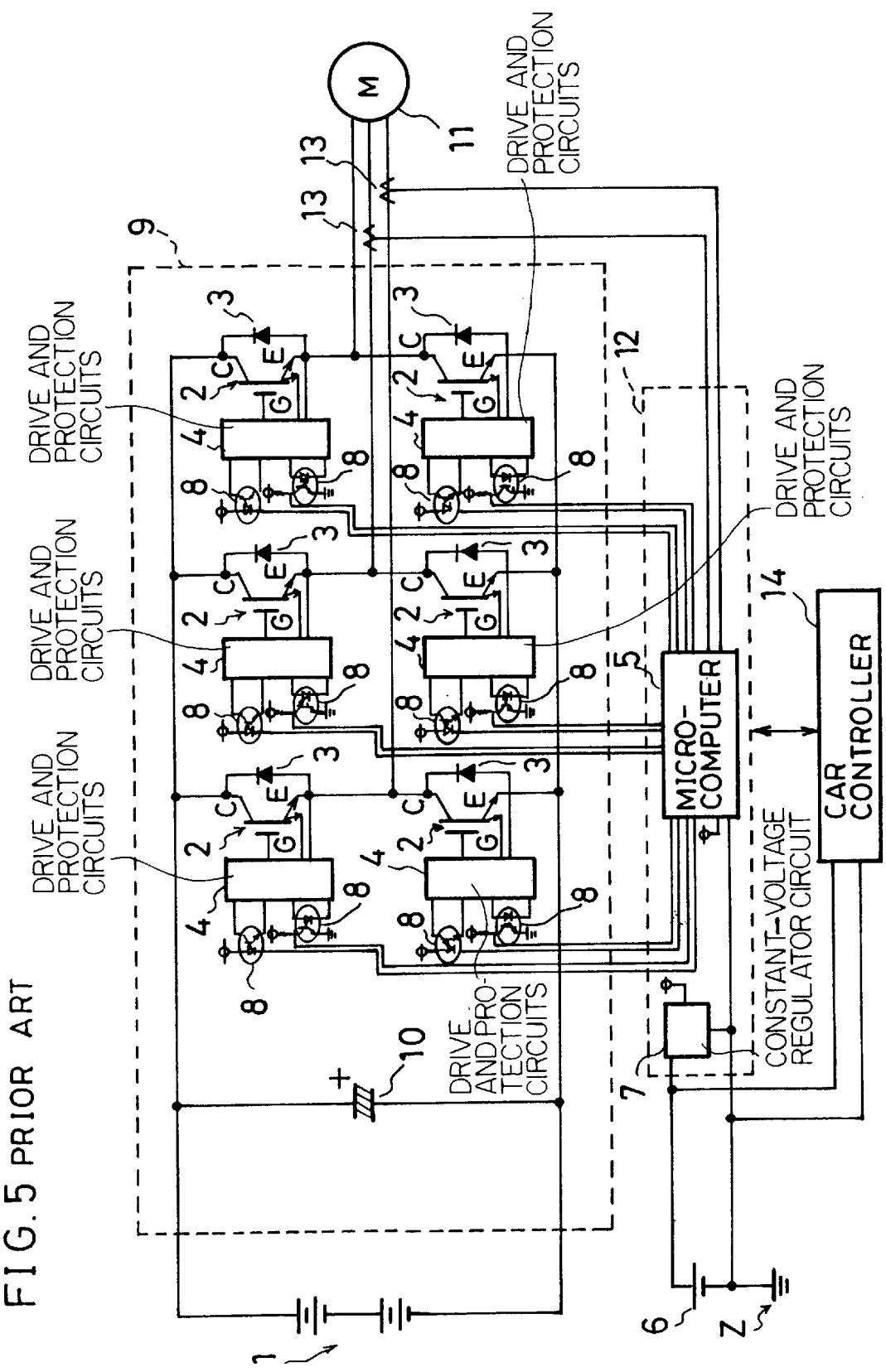
FIG. 5 is a whole circuit block diagram of a car power inverter of the prior art.

FIG. 3 is a whole circuit block diagram of a car power inverter according to Embodiment 2 of the present invention. In FIG. 3, elements having the same reference symbols as those of FIG. 1 have the same functions.

The car power inverter of this embodiment differs from the car power inverter of the prior art in that the control arithmetic unit 12 as an AC load control circuit is incorporated in the power inverter 9 and formed on the same substrate as the switching element drive and protective circuits 4. Further, as described in the above Embodiment 1, the potential of the GND of most circuits of the control arithmetic unit 12 including the microcomputer 5 is made equal to a reference potential on the low side of the arm of the switching elements 2, that is, the potential of the GND of the high-voltage DC power source 1, a signal can be transmitted to the six switching elements 2 constituting a triple bridge circuit without using an electric insulating element such as a photocoupler as if they had the same potential.

When abnormality such as overheating or short-circuit current occurs in the switching element 2, the switching element drive and protective circuit 4 handles the abnormality in response to a signal from a sensor formed on the same chip as the switching elements 2 and informs the microcomputer 5 of the abnormality through the HVIC 15.

Therefore, a high-voltage circuit can be integrated and the size of a power inversion control circuit can be reduced by carrying out electric insulation by means of a portion for transmitting a control instruction signal from a car controller 14 separate from the power inverter 9.

Since there is no step of converting an electric signal into an optical signal at the time of insulation due to the use of the HVIC 15 in place of the conventional photocoupler, the signal transmission speed is greatly improved and the switching pulse width can be effectively used, thereby expanding the range of PWM control.

Further, since the control arithmetic unit 12 including the microcomputer 5 is incorporated in the power inverter 9, the learning control function of the sensor formed on the same chip as the switching elements 2 and a protective function making use of a signal from the above sensor can be added with ease, thereby making it possible to construct a high-function power inverter. Since the HVIC 15 is not perfectly electrically insulated, an electric insulating element 17 is required between the HVIC 15 and an external car controller 14 for safety. The number of signal transmission lines may be reduced by employing general serial communication or LAN system as a system for transmitting a signal to the external car controller 14. This contributes to a reduction in the number of car wires and a reduction in the probability of a connector contact failure, resulting in improved reliability. A magnetic coupling element such as a pulse transformer may be used as the above electric insulating element 17.

In the above Embodiments 1 and 2, a general IGBT is used as the switching element 2. The same effect can be obtained by using a power element such as a bipolar transistor or MOSFET.

As having been described above, according to the first aspect of the present invention, the switching element drive and protective circuits and the control arithmetic unit are formed on the same substrate through the signal transmission means having an insulation function, and a power inversion portion comprising the switching elements and the smoothing capacitor is constructed using the same module as the substrate, thereby making it possible to reduce the signal transmission distance and the capacity of the circuit. As a result, the size of the car power inverter can be reduced and the EMC characteristics of the inverter can be improved.

According to the second aspect of the present invention, since the above signal transmission means is composed of an HVIC, a highly reliable power inverter can be obtained in a severe car environment and the delay of switching time and the rounding of waveform can be improved, thereby making it possible to use a wide duty range of PWM control waveform and expand the control range.

According to the third aspect of the present invention, since the potentials of the GND's of the switching element drive and protective circuits and the control arithmetic unit formed in the same module are made equal to the potentials of the GND's of switching elements, a high-voltage circuit can be integrated and the size of the power inverter can be reduced.

What is claimed is:

1. A car power inverter for inverting DC power into AC power and outputting the AC power comprising:

a capacitor for smoothing DC power from a DC power source;

a switching portion composed of 3 arms connected in parallel between both ends of the DC power source, each formed by a pair of switching elements connected in series;

drive and protection circuits for driving and protecting the switching elements;

a control arithmetic unit which is an AC load control circuit; and signal transmission means, comprising a high-voltage integrated circuit having the function of electrically insulating the drive and protection circuits from the control arithmetic unit, and controlling transmission of a signal between the drive and protection circuits and the control arithmetic unit for operation of said switching elements, wherein the switching element drive and protection circuits and the control arithmetic unit are formed on the same substrate through the signal transmission means, and a power inversion portion comprising the switching elements and the smoothing capacitor is modularized.

2. The car power inverter of claim 1, wherein said signal transmission means is comprised of a first signal transmission circuit for transmitting a signal from said control arithmetic unit to said switching element drive and protection circuits; and a second signal transmission circuit for transmitting a signal from said switching element drive and protection circuits to said control arithmetic unit.

3. The car power inverter of claim 1, wherein the ground potentials of the switching element drive and protection circuits and control arithmetic unit are made equal to the ground potentials of the switching elements.

* * * * *